United States Patent
Mar et al.

(10) Patent No.: US 7,085,949 B2
(45) Date of Patent: Aug. 1, 2006

(54) METHOD AND RELATED APPARATUS FOR LOCKING PHASE WITH ESTIMATED RATE MODIFIED BY RATE DITHERING

(75) Inventors: William Mar, Taipei Hsien (TW); Luke Wen, Taipei Hsien (TW)

(73) Assignee: VIA Technologies Inc., Taipei Hsien (TW)

( * ) Notice: Subject to any disclaimer, the term of this patent is extended or adjusted under 35 U.S.C. 154(b) by 379 days.

(21) Appl. No.: 10/605,193

(22) Filed: Sep. 14, 2003

(65) Prior Publication Data

US 2004/0107376 A1 Jun. 3, 2004

(30) Foreign Application Priority Data

Oct. 3, 2002 (TW) .................. 91122918 A (51) Int. Cl.
*G06F 1/12* (2006.01)

(52) U.S. Cl. ...................... 713/400; 375/373
(58) Field of Classification Search ................ 713/400; 375/373

See application file for complete search history.

(56) References Cited

U.S. PATENT DOCUMENTS

| | | | | |
|---|---|---|---|---|
| 4,105,948 A | * | 8/1978 | Wolkstein | 331/14 |
| 4,590,602 A | * | 5/1986 | Wolaver | 375/375 |
| 5,963,608 A | * | 10/1999 | Casper et al. | 375/373 |
| 6,133,770 A | * | 10/2000 | Hasegawa | 327/156 |
| 6,181,211 B1 | * | 1/2001 | Aho et al. | 331/11 |
| 6,859,509 B1 | * | 2/2005 | Koudelka | 375/373 |
| 2003/0058010 A1 | * | 3/2003 | DeCusatis et al. | 327/141 |

* cited by examiner

*Primary Examiner*—Thomas Lee
*Assistant Examiner*—Vincent Tran
(74) *Attorney, Agent, or Firm*—Winston Hsu (57) ABSTRACT

A method and related apparatus for providing a clock synchronized with an input signal. The method includes generating an estimated rate according to transitions in the input signal, processing a dithering step for updating the estimated rate by multiplying it with a predetermined ratio, and adjusting the frequency of the clock according to the updated estimated rate. The predetermined ratios used in repeated dithering steps are modified according to a predetermined rule such that the predetermined ratio is different when the dithering steps are repeated.

18 Claims, 7 Drawing Sheets

METHOD AND RELATED APPARATUS FOR LOCKING PHASE WITH ESTIMATED RATE MODIFIED BY RATE DITHERING

BACKGROUND OF INVENTION

1. Field of the Invention

The present invention relates to a method and related apparatus for locking phase, and more particularly, to a method and related apparatus for locking phase with estimated rate modified by rate dithering.

2. Description of the Prior Art

It is one of the most important bases of an information society to transfer and store a great quantity of high-density data in electronic form. This makes interchanges of information and knowledge more convenient. Thus, various circuits for processing, accessing, and transferring electronic signals are now a key to developments in the industry. The phase lock circuit is one of the most important parts of various electronic processing circuits. All the communication systems, digital communication systems and read circuit of a hard disk and a CD-ROM drive use the phase lock circuit to retrieve the clock synchronized with data (i.e. synchronized with baud rate) so that the data can be interpreted correctly.

Figure 1:
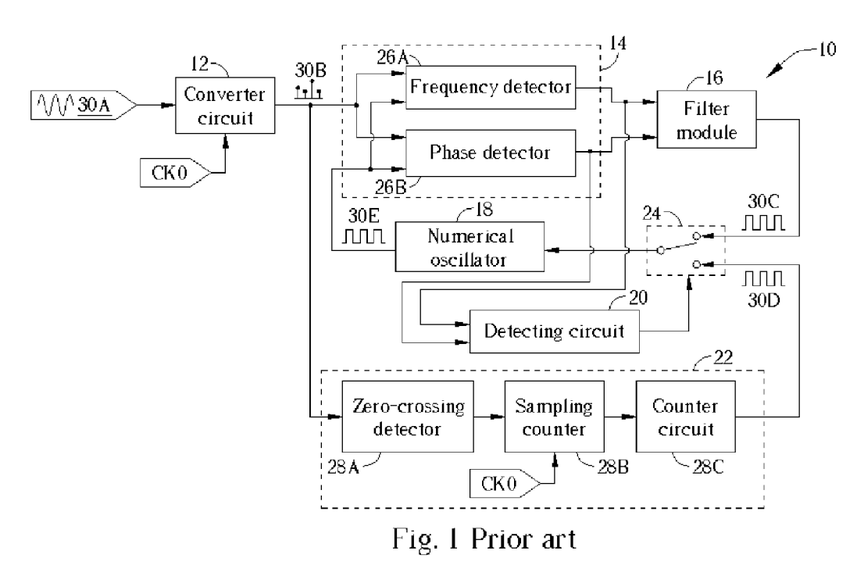
FIG. 1 is a function block diagram of a phase lock circuit according to the prior art.

Please refer to FIG. 1. FIG. 1 is a function block diagram of a phase lock circuit 10 (particularly a digital phase lock circuit) of the prior art. The phase lock circuit 10 comprises an error-test module 14, a filter module 16, a numerical oscillator 18, a detecting circuit 20, a switch circuit 24, and a measuring module 22. Assuming that the phase lock circuit 10 is a digital phase lock circuit, an analog to digital converter 12 can be applied to convert analog signals to digital signals for the convenience of digital data processing. When the phase lock circuit 10 is applied to a communication device or a data storage device (such as a hard disk or a CD-ROM drive) to retrieve the clock synchronized with data, data is often analogically carried in the data signal 30A and inputted to the phase lock circuit 10. For example, the data signal 30A can be a signal received by an antenna and demodulated in a wireless communication system, or a signal read from a magnetic or an optical media (e.g. a hard disk, a magnetic tape or an optical disk) by a pick up head of a hard disk or an optical disk drive. The converter circuit 12 can be triggered by a sampling clock CK0 to sample the data signal 30A in order to form a digital input signal 30B and input it to the phase lock circuit 10. The numerical oscillator 18 can generate a clock 30E, wherein the cycle and frequency of the clock 30E can be changed. A frequency detector 26A and a phase detector 26B can be set in the error-test module 14 to detect the frequency and phase difference between the clock 30E and the input signal 30B, and to transfer the result to the filter module 16. The filter module 16 can turn the testing result from the error-test module 14 into an estimated rate 30C for controlling the oscillation cycle of the numerical oscillator 18. Therefore combining the error-test module 14, the filter module 16, and the numerical oscillator 18 forms a phase lock loop. On the other hand, the input signal 30B is transferred to the measuring module 22 so as to generate an estimated rate 30D according to transitions in the input signal 30B. The estimated rate 30D can also be used to control the oscillation cycle of the clock 30E so as to provide an initial value for the phase lock process of the phase lock circuit. To generate an initial value by using the digital input signal 30B, a zero-crossing detector 28A, a sampling counter 28B, and a counter circuit 28C can be set in the measuring module 22.

The detecting circuit 20 of the phase lock circuit 10 is for controlling the switch circuit 24 according to the result from the error-test module 14. This allows controlling the numerical oscillator 18 according to either the estimated rate 30C from the filter module 16 or the estimated rate 30D from the measuring module 22.

Figure 2:
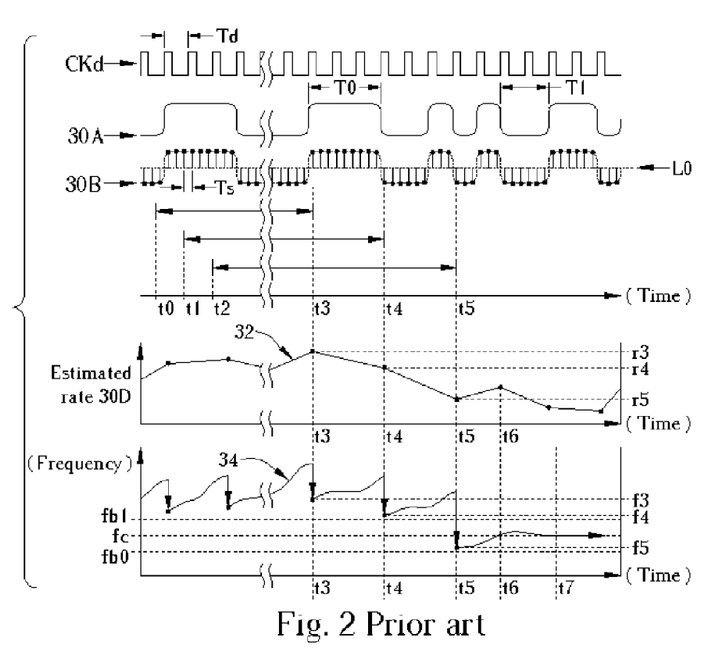
FIG. 2 is a waveform timing diagram of a phase lock process shown in FIG. 1.

Please refer to FIG. 2. FIG. 2 is a timing diagram of related waveforms and phase lock process of the phase lock circuit 10 in the prior art, where the horizontal axis represents time. Waveform timing diagrams of a data clock CKd, a data signal 30A, and an input signal 30B are shown from top to bottom in the upper part of FIG. 2, where the vertical axis represents amplitude. The curve 32 shows in FIG. 2 represents the transitions in estimated rate 30D, wherein the vertical axis represents the magnitude of the estimated rate. The curve 34 shown in FIG. 2 represents the frequency transitions in clock 30E (i.e. frequency transitions of the numerical oscillator 18), wherein the vertical axis represents the magnitude of frequency. As the data signal 30A shows in FIG. 2, pluralities of data are carried in data signal 30A, and each data corresponds to a cycle Td of the data clock CKd. In other words, the frequency of data clock CKd corresponds to the baud rate of data signal 30A. For example, three successive high-levels of data cycle Td at T0 represent three successive digital data [1], and two successive low-levels of data cycle Td at T1 represent two successive digital data [0]. This shows the data signal 30A must be interpreted correctly only by referring to the data clock CKd. For example, the numbers of digital data [1] at T1 cannot be recognized without referring to the data clock CKd.

In the application of modern electronic circuits, however, the data clock CKd is not generally transferred with the data signal 30A. In other words, the data signal 30A is interpreted without referring to the data clock CKd. In this case, the phase lock circuit 10 retrieves the clock synchronized with the data in the data signal 30A to interpret the data signal 30A. The clock 30E generated by the numerical oscillator 18 can be regarded as a data clock of the data signal 30A after the phase lock is stable. If a digital phase lock circuit 10 retrieves the data clock corresponding to data signal 30A, the data signal 30A is transferred to a digital input signal 30B by an analog to digital converter 12 in coordination with a sampling clock CK0. As shown in FIG. 2, the interval of each sampling point in input signal 30B is the sampling cycle Ts of the sampling clock CK0. The input signal 30B is then sent to both the phase lock loop and the measuring module 22.

In favor of retrieving the data clock, all data in data signal 30A are encoded so that each data in data signal 30A has a particular statistical characteristic after combination. For example, the data recorded on an optical disk are encoded, after being decoded to the data signal 30A every 1024 data (i.e. 1024 data clock cycle) have 216 data transitions on average. The data transition means the digital data is transferred from [1] to [0], or from [0] to [1]. Correspondingly, a zero-level between the high-level and low-level of the input signal 30B, sampled from the data signal 30A, can be defined (as L0 shown in FIG. 2). The data transition represents a data zero-crossing (i.e. crossing the zero-level) in the input signal 30B. For example, three zero-crossings corresponding to three data transitions occur at t3, t4, and t5. The input signal 30B crosses the zero-level from low-level to high-level at t3, and crosses the zero-level from high-level to low-level at t4. The measuring module 22 can count the zero-crossing numbers in input signal 30B by using this particular statistical characteristic. Statistically, there are 216 zero-crossings in every 1024 data. The total required time of 216 zero-crossings calculated by the measuring module 22 can be regarded as the cycle of 1024 data clocks. According to this theory, the measuring module 22 can measure the frequency of data clock and generate a corresponding estimated rate 30D.

The frequency estimation is achieved in the following steps. Counting the accumulative zero-crossing numbers by the zero-crossing detector 28A, calculating the numbers of sampling cycles Ts during the zero-crossing accumulation period by the sampling counter 28B triggered by the sampling clock CK0, and eventually calculating the estimated rate for controlling the numerical oscillator 18. In the preceding example, if there are 216 zero-crossings in every 1024 data of the data signal 30A and the input signal 30B, when the zero-crossing detector 28A begins to count the accumulative zero-crossing numbers in the input signal 30B, the sampling counter 28B will be triggered simultaneously to count the sampling point numbers. Since the sampling cycle Ts is fixed, the total required time can be known by counting the sampling point numbers (i.e. counting the numbers of sampling cycles). When the zero-crossing numbers accumulate to 216, the sampling counter will stop counting the sampling point numbers. Using a shift register of the calculating circuit 28C to divide the sampling point numbers by 1024 can obtain the average numbers of sampling cycles (also called OSR, Over Sampling Rate). Since the sampling cycle Ts is fixed, the result of above calculation represents how long the data lasts, which means how long the cycle Td of the data clock is. Similarly, the estimated rate 30B is obtained. In practice, the measuring module 22 starts to count the accumulative zero-crossing numbers at intervals to obtain a series of estimated rates. For example, as the curve 32 shows in FIG. 2, which represents the estimated rate 30D. The measuring module 22 starts to count the accumulative numbers of the zero-crossings at t0, t1, and t2. If the accumulative counting of zero-crossings starts at t0 and accumulates to 216 at t3, the measuring module 22 will generate an estimated rate 30D (r3 shown in FIG. 2) according to the accumulative numbers of input signal sampling points from t0 to t3 (effectively, the duration from t0 to t3). Similarly, if the accumulative calculation of zero-crossings starts at t1 and accumulates to 216 at t4, the measuring module 22 will generate another estimated rate 30D (r4). For this reason the measuring module 22 can generate a series of estimated rates 30D (r3 to r5) at t3, t4, t5, etc.

The characteristic "216 zero-crossing in every 1024 data", however, is a macro statistical characteristic. Theoretically, the preceding characteristic requires an infinite series of input signals 30B to carry out. If a finite data series is used, the result could be a random value near 1024 (e.g. 1022 and 1023 or 1025 and 1026). Also, the estimated rate 30D generated by the measuring module 22 will be a random distribution as the curve 32 shows in FIG. 2. Since the duration used to calculate different estimated rates overlaps, the estimated rates are correlative. For example, the estimated rate at t3 is calculated according to the input signal 30B from t0 to t3, and the estimated rate at t4 is calculated according to the input signal 30B from t1 to t4. Thus the estimated rates at t3 and t4 are both relevant to the input signal 30B from t1 to t3. That is to say the estimated rates at t3 and t4 are not statistically independent.

The measuring module 22, the error-test module 14 and the filter module 16 that are connected to the numerical oscillator 18 through a switch circuit 24 can form a typical feedback phase lock loop. After the input signal 30B and the clock 30E being compared by the error-test module 14, the comparison result is fed back to the numerical oscillator 18 to adjust the frequency (or phase) of the clock 30E through the filter module 16 connected to the switch circuit 24. During the repeating process of error testing and frequency adjusting, the clock 30E and the input signal 30B will be eventually synchronized so that the clock 30E can be locked as the data clock of the input signal 30B. However, the above-mentioned phase lock loop is not valid unless the frequency of the clock 30E and the proper baud rate of the input signal 30B (data signal 30A) are nearly. Therefore, a detecting circuit is installed in the phase lock circuit 10 to control the switch circuit 24 so that the numerical oscillator 18 can select the estimated rate 30D from the measuring module 22 or the estimated rate 30C from the filter module 16 to adjust the frequency of the clock 30E. As the curve 34 shows in FIG. 2, the frequency fc represents the frequency of the clock corresponding to the input signal 30B. The function of the phase lock circuit 10 is to lock the clock 30E frequency to fc. The frequency fb0 and fb1 represent the range where the phase lock circuit is available. In other words, if the frequency of the clock 30E is located between fb0 and fb1, the phase lock circuit can lock the clock 30E frequency to fc effectively. On the other hand, the phase lock circuit is not valid if the frequency of the clock 30E is out of the range. In this case, the estimated rate 30D from the measuring module 22 is used to readjust the frequency of the clock 30E.

In summary, the phase lock process of the phase lock circuit 10 is described as follows. When the measuring module 22 is still counting the accumulative zero-crossing numbers and not capable of providing a new estimated rate 30D, the detecting circuit 20 will control the switch circuit 24 to make the numerical oscillator 18 electrically connect to the filter module 16, then the phase lock loop will be conducted to feed the estimated rate 30C from the filter module 16 back to the numerical oscillator 18 to control the frequency of the clock 30E. When the accumulative zero-crossing numbers accumulates to a predetermined value (such as 216), the measuring module 22 will generate a new estimated rate 30D, and the detecting circuit 20 will determine the synchronization between the clock 30E and the input signal 30B according to the comparative result from the error-test module 14. If the phase (and/or the frequency) error is larger than a predetermined value, the frequency of the clock 30E is probably out of the range between fb0 and fb1. In this case, the phase lock loop is not valid. The detecting circuit 20 will then switch the switch circuit 24 to allow the numerical oscillator 18 to use the estimated rate 30D from the measuring module 22 and readjust the frequency of the clock 30E. After that, the detecting circuit 20 will switch the switch circuit 24 to continue the phase lock process. Relatively, if the comparative result from the error-test module 14 is smaller than a predetermined value, which means the frequency of the clock 30E is located in the range between fb0 and fb1, the phase lock loop will continue to synchronize the clock 30E and the input signal 30B. In this case the detecting circuit 20 will not switch the switch circuit 24. For example, as the curve 34 shows in FIG. 2, before t3 the frequency of the clock 30E is controlled by the phase lock loop, and at t3 the measuring module 22 will generate a new estimated rate 30D (i.e. r3). Simultaneously the detecting circuit 20 determines that the frequency of the clock 30E is out of the range of fb0 and fb1, the detecting circuit 20 will then switch the switch circuit 24 so as to allow the numerical oscillator 18 to use the estimated rate 30D and adjust the frequency of the clock 30E to f3 (corresponding to r3). After that the switch circuit 24 will be switched again so as to allow the phase lock circuit to adjust the frequency of the clock 30E. When the phase lock loop continuously operates from t3 to t4, the measuring module 22 will generate a new estimated rate 30D (i.e. r4) according to the accumulative zero-crossing numbers. The detecting module 20 will detect the synchronization error of the clock 30E and the input signal 30B again. If the error is too large, the detecting circuit 20 will switch the switch circuit 24 so as to allow the numerical oscillator 18 to adjust the frequency of the clock 30E to f4 (corresponding to r4) according to the estimated rate 30D at t4. After that, the switch circuit 24 will be controlled by the phase lock loop again. The phase lock loop will continuously operates from t4 to t5. After that, because the synchronization error is too large, the switch circuit 24 will be switched so that the frequency of the clock 30E will be adjusted to f5 (corresponding to r5) according to the estimated rate 30D at t5 (i.e. r5). Because f5 is located between fb0 and fb1, the frequency of the clock 30E and the input signal 30B can be synchronized in the phase lock process. The detecting circuit 20 will not switch the switch circuit 24 even when the measuring module 22 generates a new estimated rate because the synchronization error is smaller than a predetermined value, and the phase lock loop will continue operating to synchronize the frequency of the clock 30E and the input signal 30B.

The estimated rate 30D generated by the measuring module 22 is an initial value for the phase lock loop. If the frequency corresponding to the estimated rate 30D is between fb0 and fb1, the frequency of the clock 30E will be locked and synchronized in the following phase lock process. On the other hand, if the frequency corresponding to the estimated rate 30D is out of the range between fb0 and fb1, the frequency of the clock 30E cannot be synchronized in the following phase lock process. Therefore, the key to the phase lock circuit 10 is whether the estimated rate 30D falls between fb0 and fb1. As discussed above, however, the estimated rate 30D generated by the measuring module 22 in the prior art at different times are statistically correlative. In other words, if the statistical characteristic of the input signal 30B in a period of time deviates, then all of the estimated rate 30D derived from the same period of time will deviate the frequency corresponding to the proper baud rate so that successive estimated rates may not be between fb0 and fb1. Following the above-mentioned example, according to the macro statistical character of the input signal 30D, there are 216 zero-crossings in every 1024 data. But if there are 216 zero-crossings in every 1000 data during a certain period of time, all the estimated rates estimated by the measuring module 22 during this period of time will be higher than the frequency corresponding to the proper baud rate. In this case, even the detecting circuit 20 uses these estimated rates to adjust the frequency of the clock 30E, and the phase lock process cannot be accomplished in a short time. This is the reason why the phase lock process requires more time in the prior art.

SUMMARY OF INVENTION

It is therefore a primary objective of the claimed invention to provide a series of higher variance estimated rates modified by rate dithering so as to broadly cover the effective phase lock frequency range of the phase lock loop. The required time of the phase lock process can be reduced and the efficiency can be improved because less estimated rates are used.

In the prior art, the series of estimated rates are not located in the effective phase lock frequency range because of correlations of estimated rates. Even if the estimated rates are used unceasingly to adjust the phase lock process, it cannot be locked effectively.

In the present invention, a rate dithering step and related circuits are added in the phase lock circuit of the prior art. This allows generating a series of high variance estimated rates and enlarging the covering range of the estimated rates to cover the effective phase lock frequency range so that the phase lock circuit of the present invention can accomplish the phase lock process by using less estimated rates and increasing the efficiency of the phase lock circuit.

DETAILED DESCRIPTION

Figure 3:
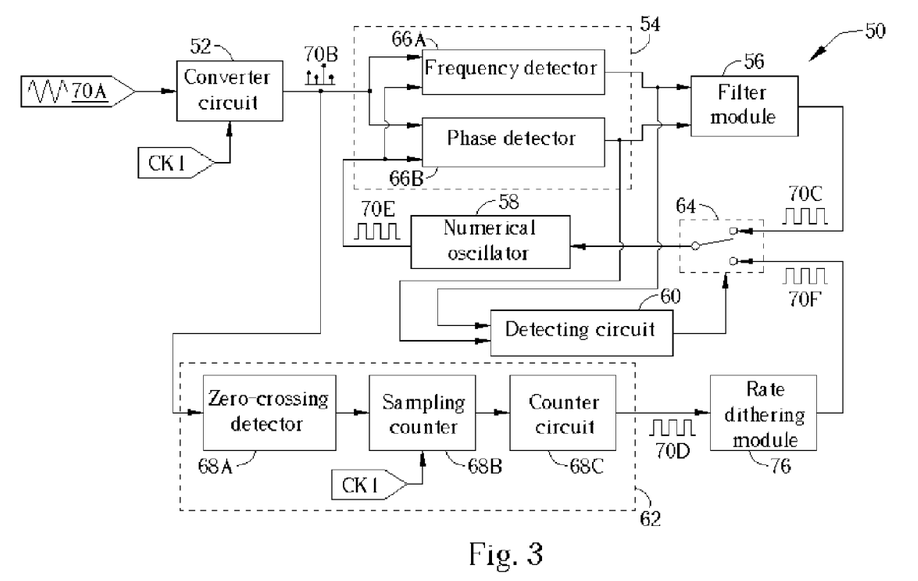
FIG. 3 is a function block diagram of a phase lock circuit according to the present invention.

Please refer to FIG. 3. FIG. 3 is a function block diagram of a phase lock circuit 50 in an embodiment of the present invention. The phase lock circuit 50 comprises an error-test module 54, a filter module 56, a numerical oscillator 58, a detecting circuit 60, a measuring module 62, a switch circuit 64, and a rate dithering module 76. The phase lock circuit 50 could be a digital phase lock circuit cooperating with a converter circuit 52 to convert an analog signal 70A to an input signal 70B. Similar to the configuration of the phase lock circuit 10 shown in FIG. 1, a clock 70E with particular frequency is generated by the numerical oscillator 58. A frequency detector 66A and a phase detector 66B are installed in the error-test module 54 to compare the frequency and phase difference between the clock 70E and the input signal 70B, and to provide the result to the filter module 56 and the detecting circuit 60. The filter module 56 can generate an estimated rate 70C according to the result provided by the error-test module 54 to control the numerical oscillator 58. The detecting circuit 60 can switch the switch circuit 64 according to the result provided by the error-test module 54. If the switch circuit 64 is switched to the filter module 56, the estimated rate 70C will be transferred to the numerical oscillator 58. The error-test module 54, the filter module 56, and the numerical oscillator 58 will then form a phase lock loop, which adjusts the frequency of the clock 70E to synchronize the clock 70E and the input signal 70B under feedback controls.

Similar to the configuration of the prior art, a measuring module 62 is installed in the present invention to generate an estimated rate 70D. The measuring module 62 comprises a zero-crossing detector 68A, a sampling counter 68B, and a counter circuit 68C. The zero-crossing numbers of the input signal 70B and the sampling point numbers in the present invention can estimate the estimated rate 70D, and the theory is similar to the prior art. One of the most different points between the phase lock circuit 50 of the present invention and the phase lock circuit 10 in the prior art is that a rate dithering module 76 is set to generate an updated estimated rate 70F after an estimated rate 70D is generated by the measuring module 62. According to the result provided by the error-test module 54, the detecting circuit determined whether it will switch the switch circuit 64 or not to adjust the frequency of the clock 70E according to the estimated rate 70F updated by the rate dithering module 76.

Figure 4:
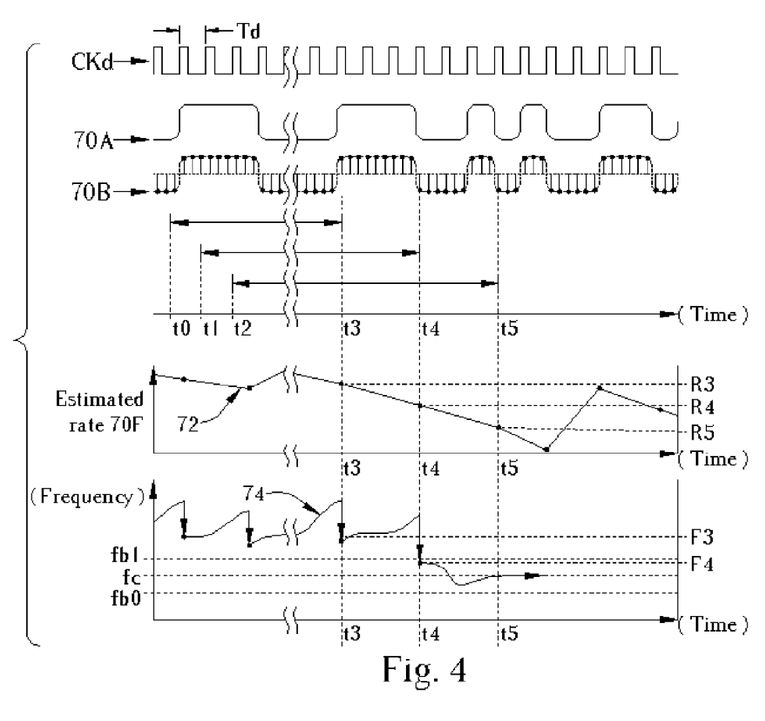
FIG. 4 is a waveform timing diagram of a phase lock process shown in FIG. 3.

Please refer to FIG. 4. FIG. 4 is a waveform timing diagram of related signals when the phase lock circuit 50 in the present invention operates, where the horizontal axis represents time. Similar to the phase lock circuit 10 in the prior art, the phase lock circuit 50 retrieves the synchronized clock 70E to interpret the data signal 70A and the input signal 70B. A clock CKd synchronized with the data signal 70A, a data signal 70A, and an input signal 70B provided by the converter circuit 52 triggered by a sampling clock CK1 are shown from top to bottom in FIG. 4, where the vertical axis of each waveform represents amplitude. The measuring module 62 can count the accumulative zero-crossing numbers and sampling point numbers of the input signal 70B to generate an estimated rate 70D. The estimated rate 70D would be transferred to the rate dithering module 76 and updated to the estimated rate 70F by the rate dithering module 76. As shown in FIG. 4, the curve 72 represents the estimated rate 70F at different times, where the vertical axis represents the corresponding rate. For example, the measuring module 62 counts the accumulative zero-crossing numbers and the sampling point numbers at t0, t1, and t2 respectively, and generates the estimated rate 70D at t3, t4, and t5. Thereafter the rate dithering module 76 will generate the updated estimated rate 70F (i.e. the rate R3, R4, and R5 at t3, t4, and t5) according to the estimated rate 70D. Once the measuring module 62 generates an estimated rate 70D, the detecting module 60 determines whether it will use the estimated rate 70F to adjust the frequency of the clock 70E according to the synchronization between the clock 70E and the input signal 70B compared by the error-test module 54. As the curve 74 representing the frequency of the clock 70E shows in FIG. 4, where the vertical axis represents frequency. The rate dithering module 76 generates an estimated rate 70F at t3, and the error of synchronization between the clock 70E and the input signal 70B is too large (exceeding a predetermined value), which means the frequency of the clock 70E is not located in the effective phase lock frequency range. In this case the detecting circuit 60 will switch the switch circuit 64 so that the numerical oscillator 58 can adjust the clock 70E to F3 (the frequency corresponding to the rate R3) according to estimated rate 70F at t3. After that, the switch circuit 64 will be switched again so as to allow the phase lock circuit feedback to control and adjust the frequency of the clock 70E. At t4, the rate dithering module 76 would generate an updated estimated rate 70F again according to the estimated rate 70D provided by the measuring module 62, and the detecting circuit 60 would let the numerical oscillator 58 to adjust the frequency of the clock 70E to F4 (frequency corresponding to the rate R4) because the phase lock error is still larger than a predetermined value. Since F4 is located in the effective phase lock frequency range, even if the rate dithering module 76 generates an updated estimated rate 70F at t5, the detecting circuit 60 would not switch the switch circuit 64 because the synchronization error is smaller than a predetermined value, the phase lock loop will continue operating to lock the frequency of the clock 70E to the frequency fc corresponding to the baud rate of the data signal 70A. In this case the clock 70E could be the retrieved clock of the phase lock circuit 50.

Figure 5:
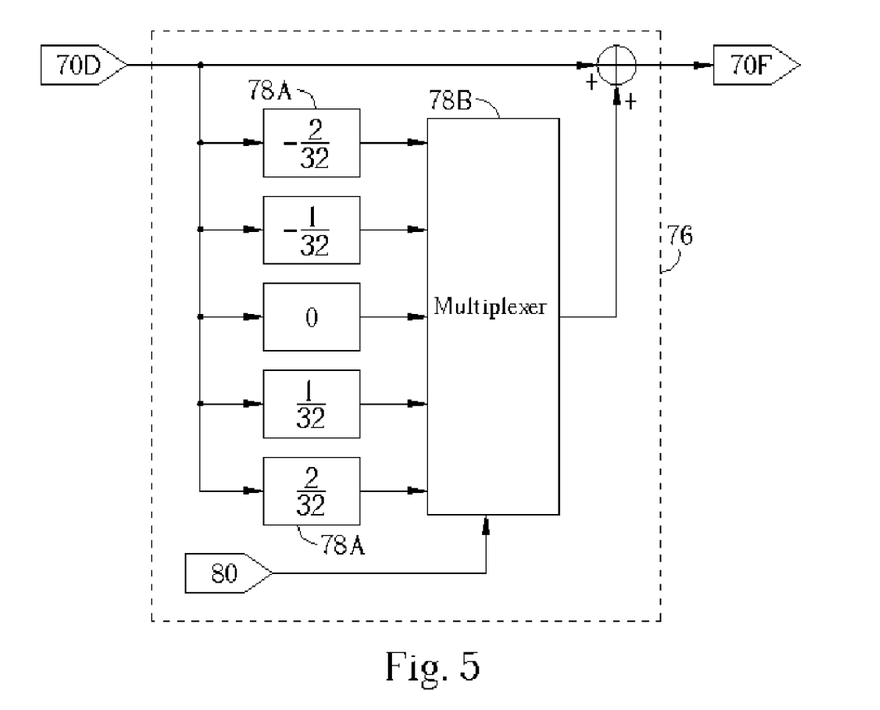
FIG. 5 is a function block diagram of a rate dithering module.

Please refer to FIG. 5. FIG. 5 is a diagram of a rate dithering module 76 of an embodiment in the present invention. In this embodiment, the rate dithering module 76 comprises 5 multipliers 78A and a multiplexer 78B. The multipliers 78A are used to multiply the estimated rate 70D by different predetermined ratios, such as 2/32, −1/32, 0, 1/32, and 2/32. The multiplexer 78B is controlled by a controlling index 80 to sum up the estimated rate 70D and one of the results multiplied by the multiplier 78A for obtaining the updated estimated rate 70F. In other words, the updated estimated rate 70F could be the estimated rate 70D multiplying by one of the five following predetermined ratios (1−2/32, 1−1/32, 1, 1+1/32, 1+2/32).

Figure 6:
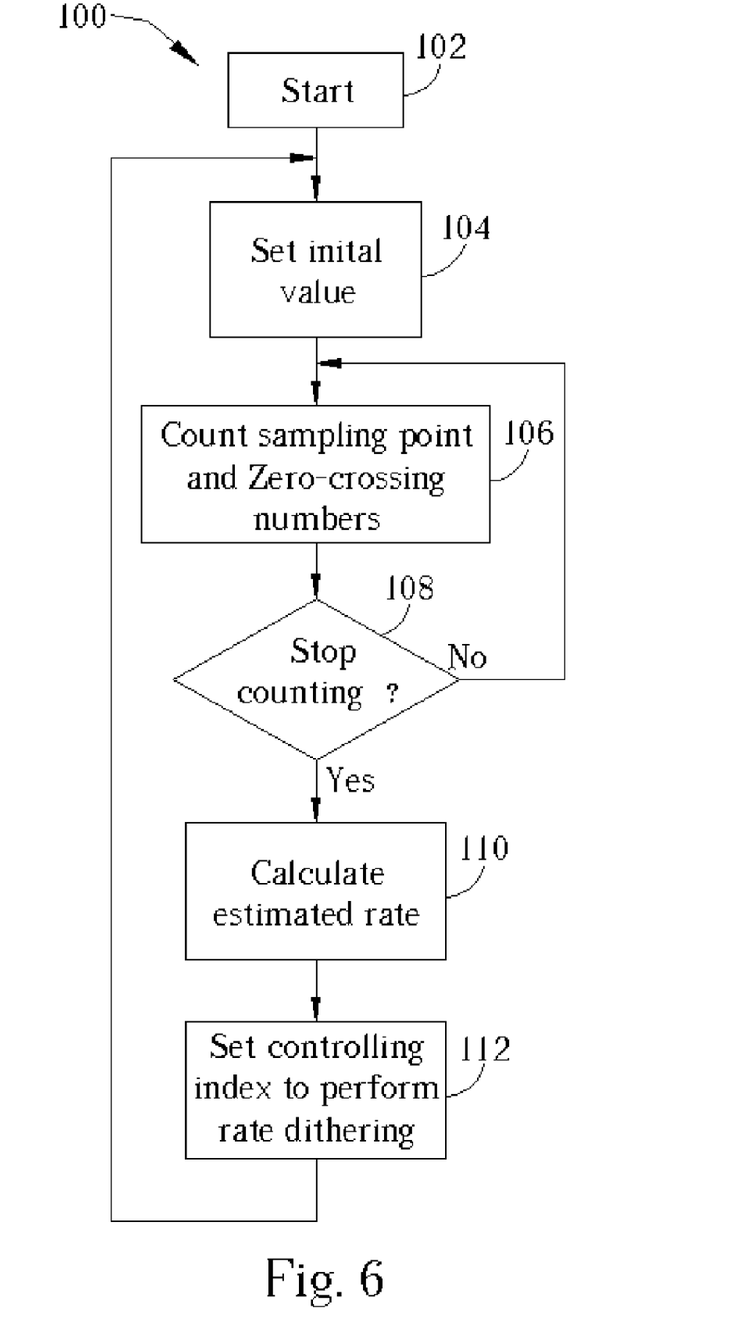
FIG. 6 is a flow chart of the dithering module working in cooperation with the measuring module shown in FIG. 5.

Please refer to FIG. 6 with reference to FIG. 3 and FIG. 5. The procedure 100 shown in FIG. 6 illustrates the procedure of the estimated rate 70F generated by the measuring module 62 working in coordination with the rate dithering module 76. Steps contained in the procedure 100 will be explained below:

Step 102: Start;

Step 104: Set initial value; reset the zero-crossing detector 68A and the sampling counter 68B in the measuring module 62;

Step 106: Count the accumulative zero-crossing numbers and sampling point numbers of the input signal 70B. The zero-crossing detector 68A can detect and count the zero-crossing numbers; the sampling counter 68B triggered by the clock CK1 can count the sampling point numbers. For example, the input signal 70B has 19 sampling points and 3 zero-crossings between t3 to t5 shown in FIG. 4;

Step 108: Stop counting and generate an estimated rate 70D if the specific condition is fulfilled. In an embodiment of the present invention, the counting is stopped if the zero-crossing numbers exceeds a predetermined number. Continuing the preceding example, the statistical characteristic of the input signal "216 zero-crossings in every 1024 data" can be used to estimate the corresponding baud rate of the input signal 70B. In this case, the counting will be stopped when the accumulative zero-crossing numbers reach 216. If the counting is not stopped, go back to step 106 and continue counting the zero-crossing numbers and the sampling point numbers. If the counting is stopped and an estimated rate is generated, perform step 110;

Step 110: Continue using the above-mentioned theory to calculate the estimated rate 70D; and Step 112: Set the controlling index 80 of the multipliers 78B in the rate dithering module 76 to perform rate dithering. In this embodiment, the controlling index 80 is set from 1 to 5 to select the ratio of the multipliers from 2/32 to 2/32 so as to allow updating the estimated rate 70D (please refer to FIG. 5). The controlling index is changed in order to perform this step. For example, the controlling index 80 is 1 when this step is first performed; the controlling index 80 is 2 when this step is performed a second time, and so on. When the controlling index 80 turns to 5, it will be returned to 1 when this step is performed a next time. When the controlling index 80 is 1, the rate dithering module 76 will store the estimated rate 70D generated by the measuring module 62 (e.g. in a buffer); when the controlling index 80 turns from 1 to 5 in order, the rate dithering module 76 will generate an updated estimated rate 70D according the corresponding 5 ratios so that 5 different updated estimated rates 70F are generated. When the controlling index 80 restarts from 1, the rate dithering module 76 will store the estimated rate 70D in order to generate 5 successive updated estimated rates 70E. When the updated estimated rates 70E are generated, go back to step 104 to continue generating successive estimated rates.

Figure 7:
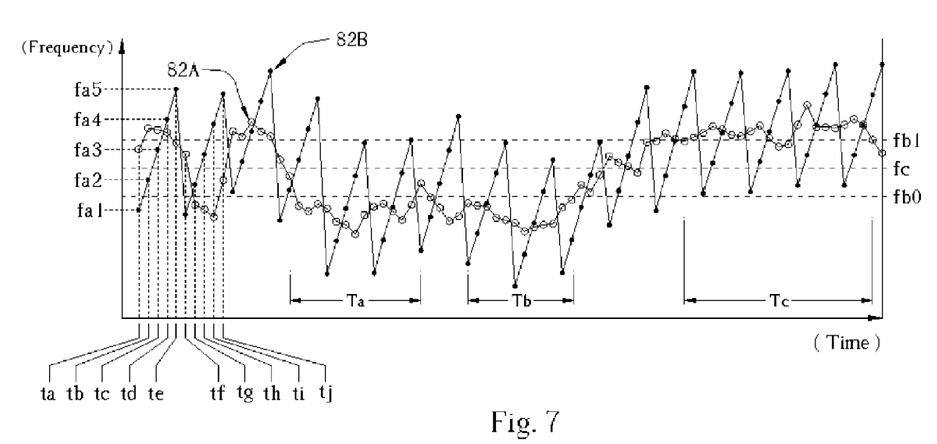
FIG. 7 is a diagram of the estimated rate transitions shown in FIG. 5.

Please refer to FIG. 7. FIG. 7 is a timing diagram of frequencies corresponding to the estimated rate 70D and 70F, where the horizontal axis represents time and the vertical axis represents frequency. Wherein the hollow circular marks 82A represent frequencies corresponding to different estimated rates 70D, where the circular marks 82B represent frequencies corresponding to different estimated rates 70F, fb0 and fb1 indicate the boundary of the effective phase lock frequency range, and fc represents the frequency corresponding to the proper baud rate of the data signal 70A. Assuming that the measuring module 62 is similar to the measuring module 22 in the prior art (shown in FIG. 1), the circular marks 82 could be regarded as the frequencies corresponding to the estimated rate 30D in the prior art. Referring to the above-mentioned theory of the rate dithering module 76, the measuring module 62 generates 5 different estimated rates 70D from ta to te. If the controlling index 80 of the rate dithering module 76 is 1 at ta in step 112, the rate dithering module 76 will generate 5 updated estimated rates 70F (corresponding to fa1 to fa5) from ta to te according to the estimated rate 70D at ta. Because the ratio of the multiplier is 0 when the controlling index 80 is 3, the estimated rate 70F at tc and the estimated rate 70D at ta are identical, corresponding to fa3. Frequencies corresponding to the 5 estimated rates 70F from ta to te are fa1 to fa5, which are respectively fa3 multiplies by (1−2/32), (1−1/32), 1, (1+1/32), (1+2/32). Similarly, the rate dithering module 76 could generate 5 different estimated rates 70F from tf to tj according to the estimated rate 70D at tf.

As shown in FIG. 7, after being updated from the estimated rate 70D by the rate dithering module 76, the frequency distribution corresponding to the estimated rate 70F is broader, which contains the effective phase lock frequency range between fb0 and fb1. For example, because of the random distribution of the estimated rate 70D and the statistical correlation between different estimated rates 70D, dozens of successive estimated rates 70D are not located in the effective phase lock frequency range of the phase lock loop at ta, tb, and tc. Relatively, several estimated rates 70F are located in the range after being dithered by the rate dithering module 76. As mentioned before, the frequency of the clock is adjusted unceasingly according to the estimated rate. When the phase lock circuit 10 in the prior art operates without the rate dithering module at Ta, Tb, or Tc, the phase lock process could not be accomplished because the estimated rate is not in the effective phase lock frequency range. Relatively, when the phase lock circuit 50 of the present invention operates at Ta, Tb, or Tc, the phase lock process is accomplished according to the estimated rate 70F located in the effective phase lock frequency range. Therefore, increasing the variance of the estimated rate 70F by rate dithering, the required time of phase lock process can be reduced and the efficiency the phase lock process can be improved in the present invention. Applying the phase lock circuit disclosed in the present invention to a read circuit of an DVD, it is found that after the rate dithering step of the present invention, it requires only 4 estimated rates 70F to locate in the effective phase lock frequency range, whereas if requires 9 estimated rates to locate in the effective phase lock frequency range in the prior art. Therefore, the present invention can approximately reduce half of the required time.

The method of rate dithering shown in FIG. 5 to FIG. 7 is merely an embodiment of the present invention; other methods can also be applied to increase the variance of the estimated rate in the present invention. For example, quantities and ratios of the multipliers 78A can be changed to generate different amount of estimated rates by different multiples. Additionally, the method of rate dithering can also be changed. For example, different estimated rates 70F can be generated by the estimated rate 70D according to different controlling index 80 at different time, such as taking (1−2/32) times of the estimated rate 70D as the estimated rate 70F at ta, and taking (1−1/32) times of the estimated rate 70D as the estimated rate 70F at tb, and so on. All methods that increase the variance of the estimated rate can be applied to the present invention.

In summary, because of the statistical correlation between different estimated rates generated by the measuring module 22, a series of estimated rates are deviated from the effective phase lock frequency range that makes the phase lock circuit of the prior art require more time. In contrast to the prior art, a rate dithering module is applied to the phase lock circuit 50 to increase the variance of each estimated rate 70F in the present invention so that the estimated rates locate in the effective phase lock frequency range more frequently. This will accelerate the phase lock process and improve the operation efficiency of the phase lock circuit.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method for locking phase by providing a clock synchronized with an input signal, the input signal comprising a plurality of data, the method comprising:
    generating an estimated rate according to transitions of the input signal;
    processing a dithering step for updating the estimated rate by multiplying the estimated rate by a predetermined ratio;
    adjusting a frequency of the clock synchronized with an input signal according to the updated estimated rate in the dithering step to make the frequency of the clock correspond to the updated estimated rate; and
    modifying the predetermined ratio so that another dithering step may apply the modified predetermined ratio to update the estimated rate;
    wherein before adjusting the frequency of the clock according to the updated estimate rate in the dithering step, if a phase difference or frequency difference between the clock and the input signal exceeds a predetermined value, the frequency of the clock is adjusted according to the updated estimated rate in the dithering step.

2. The method of claim 1 wherein the predetermined ratio will not vary with the change of the estimated rate in the dithering step when processing the dithering step.

3. The method of claim 1 further comprising changing the predetermined ratios of the adjacent dithering steps according to a predetermined rule.

4. The method of claim 1 further comprising:
    obtaining a sampling clock wherein the sampling clock comprises a plurality of sampling cycles;
    generating the input signal according to a signal level of a data signal corresponding to the sampling cycles in the sampling clock; and
    generating the estimated rate according to the number of the sampling cycles in a predetermined period of time and the number of the changes of the signal level of the input signal in the predetermined period of time.

5. The method of claim 1 wherein before adjusting the frequency of the clock according to the updated estimate rate in the dithering step, a judgment step is processed according to the phase difference or frequency difference between the clock and the input signal to decide whether the frequency of the clock is adjusted according to the updated estimated rate in the dithering step.

6. The method of claim 5 wherein in the judgment step, if the phase difference or the frequency difference between the clock and the input signal is lower than a predetermined value, the frequency of the clock is not adjusted according to the updated estimated rate in the dithering step.

7. A phase lock circuit for providing a clock synchronized with an input signal, the input signal comprising a plurality of data, the phase lock circuit comprising:
  a measuring module for generating an estimated rate according to transitions of the input signal;
  a dithering module coupled to the measuring module for updating the estimated rate by multiplying the estimated rate by a predetermined ratio;
  an oscillator for adjusting a frequency of the clock synchronized with an input signal according to the updated estimated rate in the dithering module to make the frequency of the clock correspond to the updated estimated rate; and
  an error-test module for generating a frequency adjustment value according to phase difference or frequency difference between the clock and the input signal wherein when the phase difference or the frequency difference between the clock and the input signal is lower than a predetermined value, the updated estimated rate of the dithering module ceases to be transmitted to the oscillator and the frequency adjustment value of the error-test module is transmitted to the oscillator, so that the oscillator can adjust the frequency of the clock according to the frequency adjustment value;
  wherein after the dithering module updates the estimated rate, the predetermined ratio is modified to multiply the estimated rate by a modified predetermined ratio for updating the estimated rate in the dithering module when the dithering module generates another updated estimated rate.

8. The phase lock circuit of claim 7 wherein the predetermined ratio of the dithering module will not vary with the change of the estimated rate of the measuring module.

9. The phase lock circuit of claim 7 wherein the dithering module modifies the predetermined ratio after the estimated rate is updated according to a predetermined rule, so that the modified predetermined ratio can be used when the estimated rate is updated the next time.

10. The phase lock circuit of claim 7 further comprising:
  a converter for receiving a sampling clock that comprises a plurality of sampling cycles and for generating the input signal according to a signal level of a data signal corresponding to the sampling cycles in the sampling clock;
  wherein the measuring module generates the estimated rate according to the number of the sampling cycles in a predetermined period of time and the number of the changes of the signal level of the input signal.

11. The phase lock circuit of claim 7 further comprising a detecting circuit for deciding whether the updated estimated rate of the dithering module is transmitted to the oscillator to adjust the frequency of the clock according to a phase difference or frequency difference between the clock and the input signal.

12. The phase lock circuit of claim 11 wherein if the detecting circuit detects that the phase difference or the frequency difference between the clock and the input signal exceeds a predetermined value, the updated estimated rate of the dithering module is transmitted to the oscillator.

13. A method for locking phase by providing a comparing clock synchronized with an input signal, the input signal comprising a plurality of data, the method comprising:
  generating a frequency adjustment value according to the input signal;
  generating a dithering estimated value according to the input signal through a dithering step;
  setting a dithering estimated value as a new comparing clock when a synchronization error between the comparing clock and the input signal exceeds a predetermined value;
  setting the frequency adjustment value as the new comparing clock when the synchronization error between the comparing clock and the input signal does not exceed the predetermined value; and
  comparing the new comparing clock with the input signal in order to adjust the new comparing clock.

14. The method of claim 13 wherein the dithering step is used to generate an estimated rate according to transitions of the input signal and to generate the dithering estimated value by multiplying the estimated rate by a predetermined ratio.

15. The method of claim 14 wherein the predetermined ratio will not vary with the change of the estimated rate in the dithering step.

16. The method of claim 14 wherein the predetermined ratio of the adjacent dithering step is changed according to a predetermined rule.

17. The method of claim 13 further comprising adjusting the frequency of the comparing clock according to a phase difference or frequency difference between the comparing clock and the input signal.

18. The method of claim 13 further comprising: generating an estimated rate according to the number of sampling cycles in a predetermined period of time and the number of the changes of signal level of the input signal in the predetermined period; and generating the dithering estimated value in the dithering step according to the estimated rate.

* * * * *